US011615981B2

United States Patent
Oda et al.

(10) Patent No.: US 11,615,981 B2
(45) Date of Patent: Mar. 28, 2023

(54) ISOLATOR

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Tatsuhiro Oda, Yokohama (JP); Tatsuya Ohguro, Nonoichi (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 0 days.

(21) Appl. No.: 17/191,776

(22) Filed: Mar. 4, 2021

(65) Prior Publication Data
US 2021/0287931 A1 Sep. 16, 2021

(30) Foreign Application Priority Data
Mar. 10, 2020 (JP) .............................. JP2020-041055

(51) Int. Cl.
*H01L 21/762* (2006.01)
*H01L 21/28* (2006.01)
(52) U.S. Cl.
CPC .. *H01L 21/76232* (2013.01); *H01L 21/28044* (2013.01); *H01L 21/76243* (2013.01)
(58) Field of Classification Search
CPC . H01L 28/10; H01L 23/5227; H01L 27/0288; H01L 27/0629–0635;
(Continued)

(56) References Cited

U.S. PATENT DOCUMENTS

2001/0051420 A1 12/2001 Besser et al.
2005/0153505 A1 7/2005 Gambino et al.
(Continued)

FOREIGN PATENT DOCUMENTS

JP 2003-520448 A 7/2003
JP 4162241 B2 10/2008
(Continued)

*Primary Examiner* — Julio J Maldonado
*Assistant Examiner* — Stanetta D Isaac
(74) *Attorney, Agent, or Firm* — Oblon, McClelland, Maier & Neustadt, L.L.P.

(57) ABSTRACT

According to one embodiment, an isolator includes first and second conductive members, and first second, and third insulating members. The first conductive member includes first, second, and third partial regions. The third partial region is between the first and second partial regions. The second conductive member is electrically connected to the first conductive member. The second conductive member includes fourth and fifth partial regions. The fourth partial region is between the third and fifth partial regions. The first insulating member includes first and second insulating regions. The fifth partial region is between the first and second insulating regions. The second insulating member includes third and fourth insulating regions. The fourth partial region is between the third and fourth insulating regions. The third insulating member includes first and second portions.

27 Claims, 5 Drawing Sheets

(58) Field of Classification Search
CPC ..... H01L 27/0647–0658; H01L 27/067–0682; H01L 27/0711–0738; H01L 27/0755; H01L 27/0772–0794; H01L 27/0802–0811; H01L 27/1255; H01L 29/0649–0653; H01L 2221/1042–1047; H01L 29/4991; H01L 29/515
See application file for complete search history.

(56) References Cited

U.S. PATENT DOCUMENTS

| | | |
|---|---|---|
| 2009/0212437 A1 | 8/2009 | Kumagai et al. |
| 2013/0321094 A1 | 12/2013 | Sumida et al. |
| 2016/0163641 A1* | 6/2016 | Bao .................. H01L 21/3065 438/3 |

FOREIGN PATENT DOCUMENTS

| | | |
|---|---|---|
| JP | 2009-206241 A | 9/2009 |
| JP | 5729485 B2 | 6/2015 |

* cited by examiner

ISOLATOR

CROSS-REFERENCE TO RELATED APPLICATIONS

This application is based upon and claims the benefit of priority from Japanese Patent Application No. 2020-041055, filed on Mar. 10, 2020; the entire contents of which are incorporated herein by reference.

FIELD

Embodiments described herein generally relate to an isolator.

BACKGROUND

An isolator is used in an electronic device or the like. More stable characteristics of the isolator are desirable.

DETAILED DESCRIPTION

Figure 1:
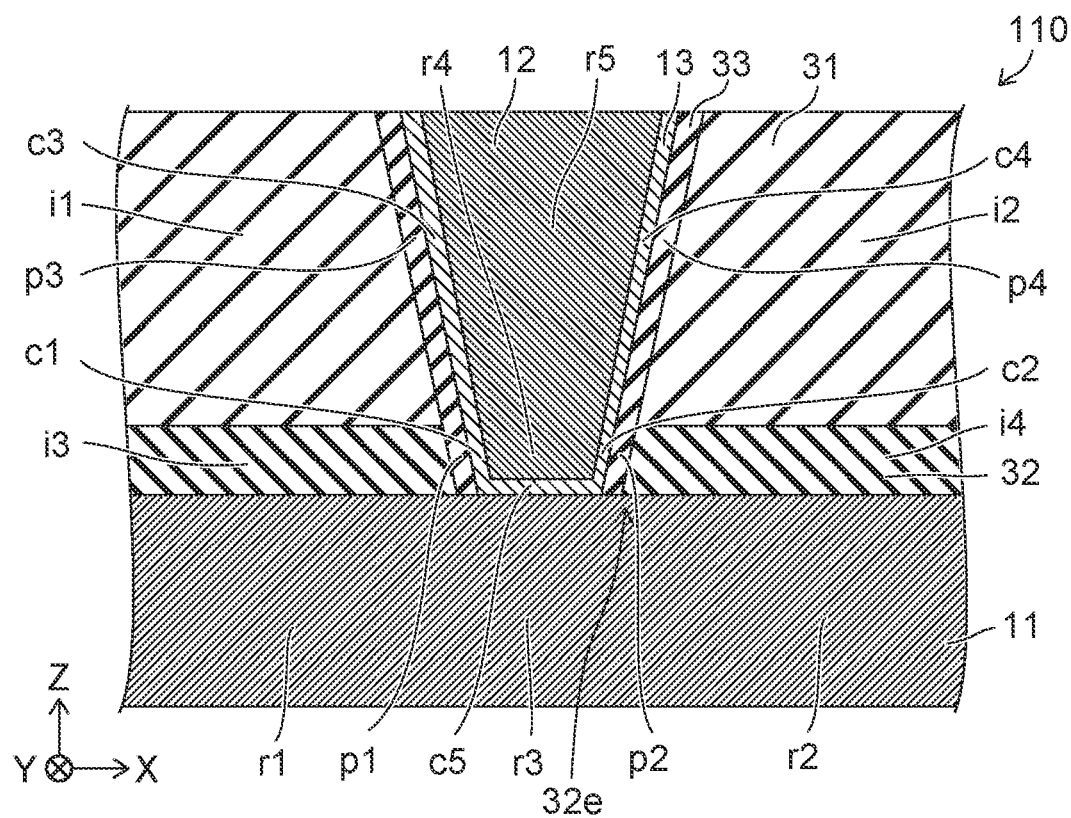
FIG. 1 is a schematic cross-sectional view illustrating an isolator according to a first embodiment.

According to one embodiment, an isolator includes a first conductive member, a second conductive member, a first insulating member, a second insulating member, and a third insulating member. The first conductive member includes a first partial region, a second partial region, and a third partial region. A direction from the first partial region toward the second partial region is along a first direction. The third partial region is between the first partial region and the second partial region. The second conductive member is electrically connected to the first conductive member. The second conductive member includes a fourth partial region and a fifth partial region. The fourth partial region is between the third partial region and the fifth partial region in a second direction crossing the first direction. The first insulating member includes a first insulating region and a second insulating region. The fifth partial region is between the first insulating region and the second insulating region in the first direction. The second insulating member includes a third insulating region and a fourth insulating region. The fourth partial region is between the third insulating region and the fourth insulating region in the first direction. The third insulating region is between the first partial region and the first insulating region in the second direction. The fourth insulating region is between the second partial region and the second insulating region in the second direction. The second insulating member includes silicon and nitrogen. The third insulating member includes a first portion and a second portion. The first portion is between the third insulating region and the fourth partial region in the first direction. The second portion is between the fourth partial region and the fourth insulating region in the first direction. A Young's modulus of the third insulating member is less than a Young's modulus of the second insulating member.

According to one embodiment, an isolator includes a first conductive member, a second conductive member, a first insulating member, a second insulating member, and a third insulating member. The first conductive member includes a first partial region, a second partial region, and a third partial region. A direction from the first partial region toward the second partial region is along a first direction. The third partial region is between the first partial region and the second partial region. The second conductive member is electrically connected to the first conductive member. The second conductive member includes a fourth partial region and a fifth partial region. The fourth partial region is between the third partial region and the fifth partial region in a second direction crossing the first direction. The first insulating member includes a first insulating region and a second insulating region. The fifth partial region is between the first insulating region and the second insulating region in the first direction. The second insulating member includes a third insulating region and a fourth insulating region. The fourth partial region is between the third insulating region and the fourth insulating region in the first direction. The third insulating region is between the first partial region and the first insulating region in the second direction. The fourth insulating region is between the second partial region and the second insulating region in the second direction. The second insulating member includes silicon and nitrogen. The third insulating member includes a first portion and a second portion. The first portion is between the third insulating region and the fourth partial region in the first direction. The second portion is between the fourth partial region and the fourth insulating region in the first direction. The third insulating member includes silicon and oxygen.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with the same reference numerals, and a detailed description is omitted as appropriate.

First Embodiment

Figure 2:
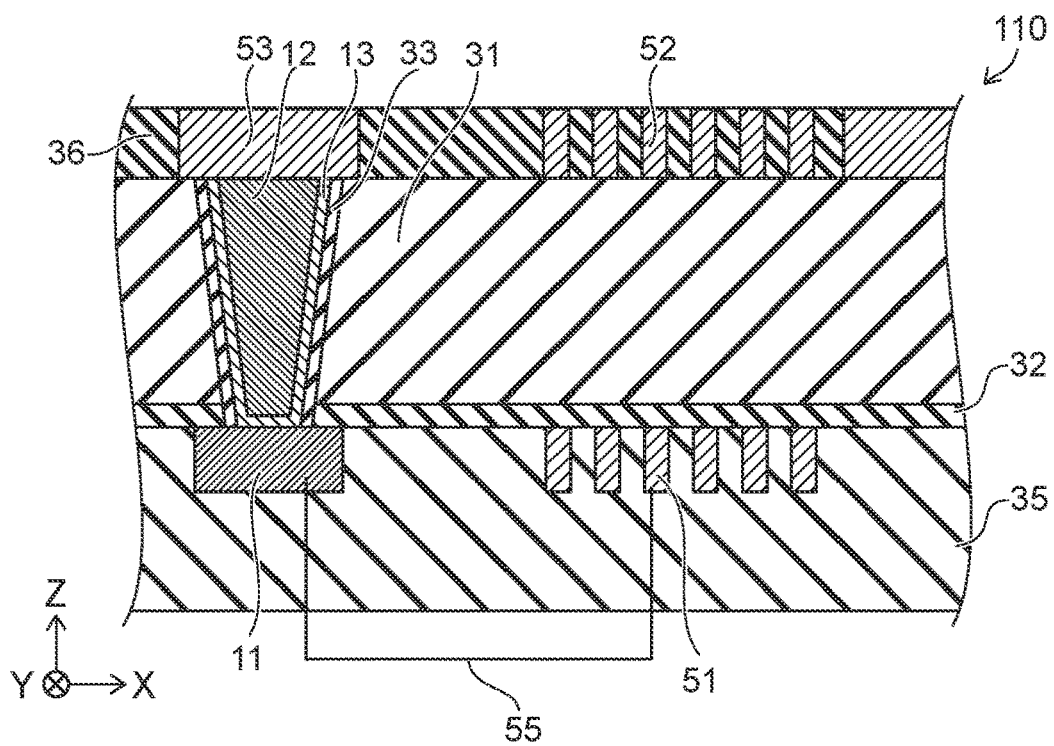
FIG. 2 is a schematic cross-sectional view illustrating the isolator according to the first embodiment.

FIGS. 1 and 2 are schematic cross-sectional views illustrating an isolator according to a first embodiment.

FIG. 1 illustrates a portion of FIG. 2.

As shown in FIG. 1, the isolator 110 according to the embodiment includes a first conductive member 11, a second conductive member 12, a first insulating member 31, a second insulating member 32, and a third insulating member 33.

The first conductive member 11 includes a first partial region r1, a second partial region r2, and a third partial region r3. The direction from the first partial region r1 toward the second partial region r2 is along a first direction.

The first direction is taken as an X-axis direction. One direction perpendicular to the X-axis direction is taken as a Z-axis direction. A direction perpendicular to the X-axis direction and the Z-axis direction is taken as a Y-axis direction.

The third partial region r3 is between the first partial region r1 and the second partial region r2 in the first direction (the X-axis direction).

The second conductive member 12 includes a fourth partial region r4 and a fifth partial region r5. The second conductive member 12 is electrically connected to the first conductive member 11. The fourth partial region r4 is between the third partial region r3 and the fifth partial region r5 in the second direction. The second direction crosses the first direction. The second direction is, for example, the Z-axis direction.

The first insulating member 31 includes a first insulating region it and a second insulating region i2. The fifth partial region r5 is between the first insulating region i1 and the second insulating region i2 in the first direction (the X-axis direction).

The second insulating member 32 includes a third insulating region i3 and a fourth insulating region i4. The fourth partial region r4 is between the third insulating region i3 and the fourth insulating region i4 in the first direction (the X-axis direction). The third insulating region i3 is between the first partial region r1 and the first insulating region i1 in the second direction (e.g., the Z-axis direction). The fourth insulating region i4 is between the second partial region r2 and the second insulating region i2 in the second direction (the Z-axis direction).

The third insulating member 33 includes a first portion p1 and a second portion p2. The first portion p1 is between the third insulating region i3 and the fourth partial region r4 in the first direction (the X-axis direction). The second portion p2 is between the fourth partial region r4 and the fourth insulating region i4 in the first direction. For example, the first portion p1 contacts the third insulating region i3. The second portion p2 contacts the fourth insulating region i4.

As shown in FIG. 2, the isolator 110 may further include a first conductive part 51 and a second conductive part 52. For example, these conductive parts function as antennae. As shown in FIG. 2, a portion of the first insulating member 31 is between the first conductive part 51 and the second conductive part 52 in the second direction (the Z-axis direction). One of the first conductive part 51 or the second conductive part 52 is electrically connected to one of the first conductive member 11 or the second conductive member 12. In the example, the first conductive part 51 is electrically connected to the first conductive member 11.

In the example, the isolator 110 includes a connection member 55. The connection member 55 electrically connects one of the first conductive part 51 or the second conductive part 52 and one of the first conductive member 11 or the second conductive member 12. In the example, the connection member 55 electrically connects the first conductive part 51 and the first conductive member 11.

The first conductive member 11 and the second conductive member 12 function as a connector that is connected with one of a conductive part provided at one surface (e.g., the lower surface) of the first insulating member 31 or another conductive part provided at another surface (e.g., the upper surface) of the first insulating member 31. The isolator 110 is, for example, a digital isolator.

According to the embodiment, the Young's modulus of the third insulating member 33 is less than the Young's modulus of the second insulating member 32. The Young's modulus of the second insulating member 32 is, for example, not less than 200 GPa and not more than 400 Pa.

The Young's modulus of the third insulating member 33 is, for example, not less than 50 GPa and not more than 100 Pa. The Young's modulus of the third insulating member 33 is, for example, not more than ½ of the Young's modulus of the second insulating member 32.

By providing such a third insulating member 33, stress that is generated in the second insulating member 32 is relaxed. For example, delamination is suppressed. For example, cracks are suppressed. For example, a good electrical connection is stably obtained. For example, high reliability is obtained.

It was found that in a reference example in which the third insulating member 33 is not provided, a large stress is generated at an end portion 32e of the second insulating member 32 (the corner at the first conductive member 11 side and the second conductive member 12 side (referring to FIG. 1)). It was found that delamination or cracks easily occur at the end portion 32e of the second insulating member 32 due to the stress.

According to the embodiment, the stress is relaxed by providing the third insulating member 33 that has a low Young's modulus. For example, a good electrical connection is obtained thereby. For example, high reliability is obtained. According to the embodiment, an isolator can be provided in which stable characteristics are obtained.

For example, in the reference example in which the third insulating member 33 is not provided, the stress that is generated at the end portion 32e of the second insulating member 32 is 4 GPa. Conversely, according to the embodiment in which the third insulating member 33 that has a low Young's modulus is provided, the stress that is generated at the end portion 32e of the second insulating member 32 is 2.6 GPa. Thus, according to the embodiment, the stress can be suppressed.

The second insulating member 32 includes, for example, silicon and nitrogen. The second insulating member 32 includes, for example, SiN. The second insulating member 32 includes, for example, $Si_3N_4$, etc. Chemically stable characteristics in the second insulating member 32 are obtained thereby. For example, the second insulating member 32 functions as an etching stopper when patterning, etc. For example, the second insulating member 32 may function as a protective film.

Such a material that is used as the second insulating member 32 has a high Young's modulus. Therefore, the stress easily concentrates. For example, there are cases where delamination and cracks occur between the second insulating member 32 and the first conductive member 11 and/or between the second insulating member 32 and the second conductive member 12 due to the thermal expansion coefficient differences between the second insulating member 32 and the first and second conductive members 11 and 12, etc.

On the other hand, for example, the third insulating member 33 includes silicon and oxygen. According to the third insulating member 33 that includes such a material, a low Young's modulus is obtained. The stress is relaxed by applying the third insulating member 33 that includes such a material. An isolator can be provided in which stable characteristics are obtained.

According to the embodiment, the third insulating member 33 may further include at least one selected from the group consisting of nitrogen and carbon. By the third insulating member 33 including these elements, the characteristics of the third insulating member 33 can be adjusted.

For example, the second insulating member 32 may not include oxygen. Or, the oxygen concentration in the second insulating member 32 may be less than the oxygen concentration in the third insulating member 33. By such a second insulating member 32, for example, a higher chemical resistance of the second insulating member 32 is obtained.

In one example, the Young's modulus of the third insulating member 33 is, for example, less than the Young's modulus of the second conductive member 12. Delamination or cracks can be more effectively suppressed.

In one example, the Young's modulus of the first insulating member 31 is less than the Young's modulus of the second insulating member 32. The local stress can be further suppressed thereby.

The first insulating member 31 includes, for example, silicon oxide made using TEOS (tetraethoxysilane). A low Young's modulus is obtained thereby.

In the example as shown in FIG. 1, the isolator 110 further includes a third conductive member 13. The third conductive member 13 includes a first conductive region c1 and a second conductive region c2. The first conductive region c1 is between the first portion p1 and the fourth partial region r4 in the first direction (the X-axis direction). The second conductive region c2 is between the fourth partial region r4 and the second portion p2 in the first direction.

The third conductive member 13 is, for example, a barrier metal. By providing the third conductive member 13, for example, a high adhesion force is obtained. For example, delamination, etc., can be suppressed.

For example, the Young's modulus of the third insulating member 33 is less than the Young's modulus of the third conductive member 13. The stress is further relaxed thereby. An isolator can be provided in which more stable characteristics are obtained.

For example, the third conductive member includes at least one selected from the group consisting of Ti, Ta, TiN, and TaN. For example, a high adhesion force is easily obtained.

According to the embodiment, at least one of the first conductive member 11 or the second conductive member 12 includes at least one selected from the group consisting of copper, aluminum, and tungsten. For example, a low resistance is easily obtained.

As shown in FIG. 1, the third insulating member 33 may include a third portion p3 and a fourth portion p4. The third portion p3 is between the first insulating region i1 and the fifth partial region r5 in the first direction (the X-axis direction). The fourth portion p4 is between the fifth partial region r5 and the second insulating region i2 in the first direction.

As shown in FIG. 1, the third conductive member 13 may include a third conductive region c3 and a fourth conductive region c4. The third conductive region c3 is between the third portion p3 and the fifth partial region r5 in the first direction (the X-axis direction). The fourth conductive region c4 is between the fifth partial region r5 and the fourth portion p4 in the first direction.

As shown in FIG. 1, the third conductive member 13 may include a fifth conductive region c5. The fifth conductive region c5 is between the third partial region r3 and the fourth partial region r4. When the fifth conductive region c5 is provided, the second conductive member 12 is electrically connected to the first conductive member 11 via the fifth conductive region c5.

For example, the first conductive region c1 contacts the first portion p1 and the fourth partial region r4. The second conductive region c2 contacts the fourth partial region r4 and the second portion p2.

For example, the second insulating member 32 is provided around the fourth partial region r4 in the X-Y plane. For example, the first insulating member 31 is provided around the fifth partial region r5 in the X-Y plane. For example, the third insulating member 33 is located between the fourth partial region r4 and the second insulating member 32. The third insulating member 33 is located between the fifth partial region r5 and the first insulating member 31. The third insulating member 33 is, for example, ring-shaped.

For example, at least a portion of the third conductive member 13 is provided between the second conductive member 12 and the third insulating member 33 in the X-Y plane. The third conductive member 13 is, for example, ring-shaped. The third insulating member 33 is, for example, a spacer layer.

An electrode 53 may be provided as shown in FIG. 2. For example, the second conductive member 12 is between the first conductive member 11 and the electrode 53 in the Z-axis direction. For example, the second conductive member 12 electrically connects the first conductive member 11 and the electrode 53. As shown in FIG. 2, an insulating member 36 may be provided around the electrode 53 and the second conductive part 52. An insulating member 35 may be provided around the first conductive member 11 and the first conductive part 51.

Figure 3:
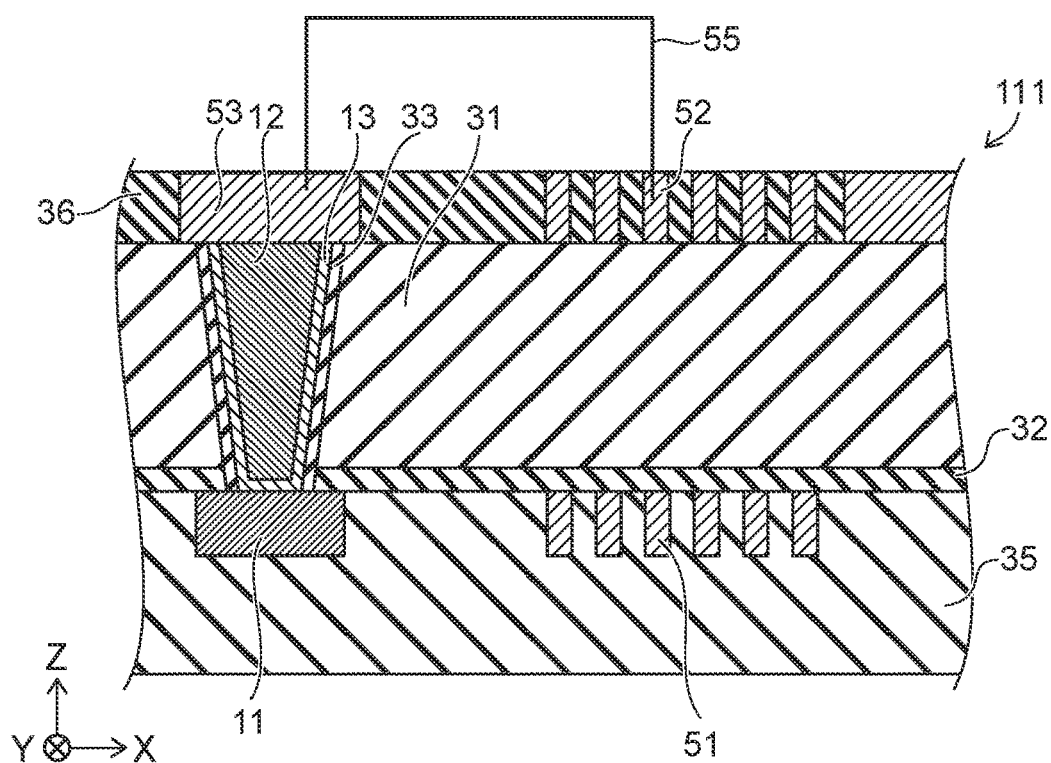
FIG. 3 is a schematic cross-sectional view illustrating an isolator according to the first embodiment.

FIG. 3 is a schematic cross-sectional view illustrating an isolator according to the first embodiment.

In the isolator 111 according to the embodiment as shown in FIG. 3, the connection member 55 electrically connects the second conductive part 52 and the second conductive member 12. Otherwise, the configuration of the isolator 111 may be similar to the configuration of the isolator 110. In the isolator 111 as well, an isolator can be provided in which stable characteristics are obtained.

An example of the isolator 110 will now be described further. The description recited below also is applicable to the isolator 111.

Figure 4:
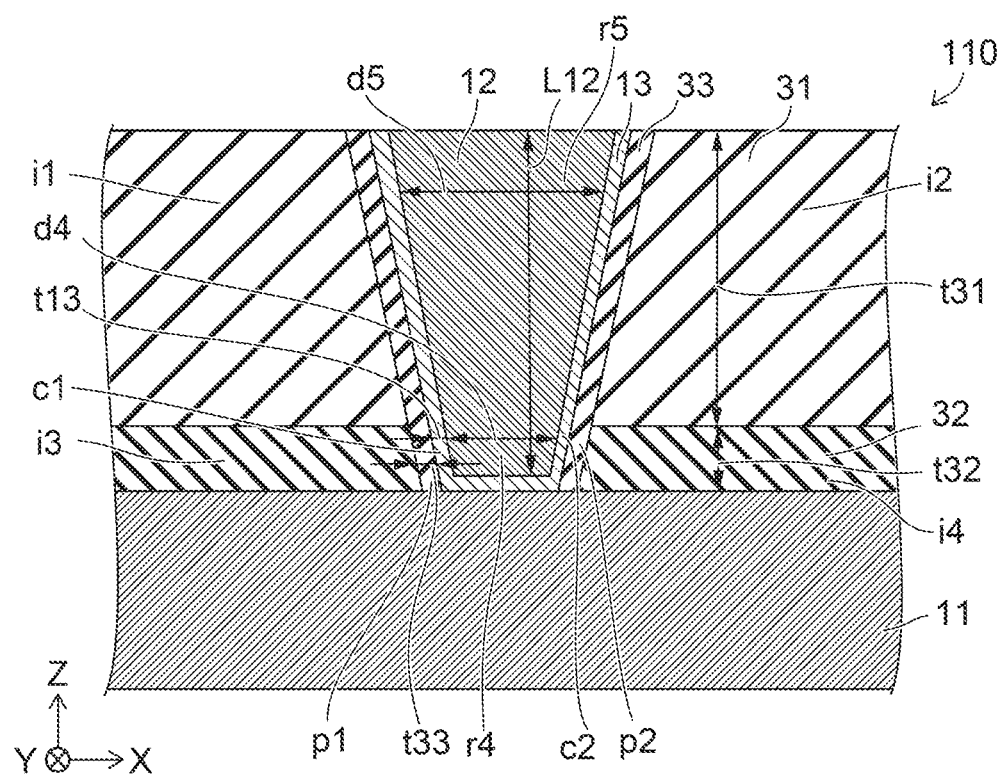
FIG. 4 is a schematic cross-sectional view illustrating the isolator according to the first embodiment.

FIG. 4 is a schematic cross-sectional view illustrating the isolator according to the first embodiment.

In the isolator 110 as shown in FIG. 4, the length along the second direction (the Z-axis direction) of the first insulating member 31 is taken as a thickness t31. The thickness t31 is, for example, not less than 5 μm. The thickness t31 may be, for example, not less than 8 μm. The thickness t31 may be, for example, not less than 10 μm. By providing the first insulating member 31 that is thick, electrical insulation between the first conductive part 51 and the second conductive part 52 is stably obtained. The thickness t31 is, for example, the thickness of the first insulating region i1 or the thickness of the second insulating region i2.

The length along the second direction (the Z-axis direction) of the second insulating member 32 is taken as a thickness t32. The thickness t32 is, for example, not less than 5 nm and not more than 20 nm. A stable etching-stop function of the second insulating member 32 is obtained thereby. The thickness t32 is, for example, the thickness of the third insulating region i3 or the thickness of the fourth insulating region i4.

The length along the first direction (the X-axis direction) of the third insulating member 33 is taken as a thickness t33. The thickness t33 is, for example, not less than 20 nm and not more than 100 nm. For example, the stress that is generated in the second insulating member 32 can be relaxed thereby. The thickness t33 is, for example, the length along the first direction of the first portion p1 or the length along the first direction of the second portion p2.

The length along the first direction (the X-axis direction) of the third conductive member 13 is taken as a thickness t13. The thickness t13 is, for example, not less than 10 nm and not more than 100 nm. For example, the diffusion of the elements included in the second conductive member 12, etc., can be suppressed thereby. The thickness t13 may be, for example, the length along the first direction of the first conductive region c1 or the length along the first direction of the second conductive region c2.

As shown in FIG. 4, the length along the second direction (the Z-axis direction) of the second conductive member 12 is taken as a length L12. The length L12 is, for example, not less than 5 μm. The length L12 may be, for example, not less than 8 μm. The length L12 may be, for example, not less than 10 μm.

The length along the first direction (the X-axis direction) of the fourth partial region r4 is taken as a length d4. The length d4 is, for example, not less than 0.5 times and not more than 1 times the length L12. The length d4 is, for example, not less than 5 μm. The length d4 may be, for example, not less than 8 μm. The length d4 may be, for example, not less than 10 μm. The volume of the second conductive member 12 is large.

The length along the first direction (the X-axis direction) of the fifth partial region r5 is taken as a length d5. In the example shown in FIG. 4, the length d4 of the fourth partial region r4 is less than the length d5 of the fifth partial region r5. For example, the second conductive member 12 is tapered. As described below, the side surface of the second conductive member 12 may be substantially perpendicular to the X-Y plane.

Figure 5:
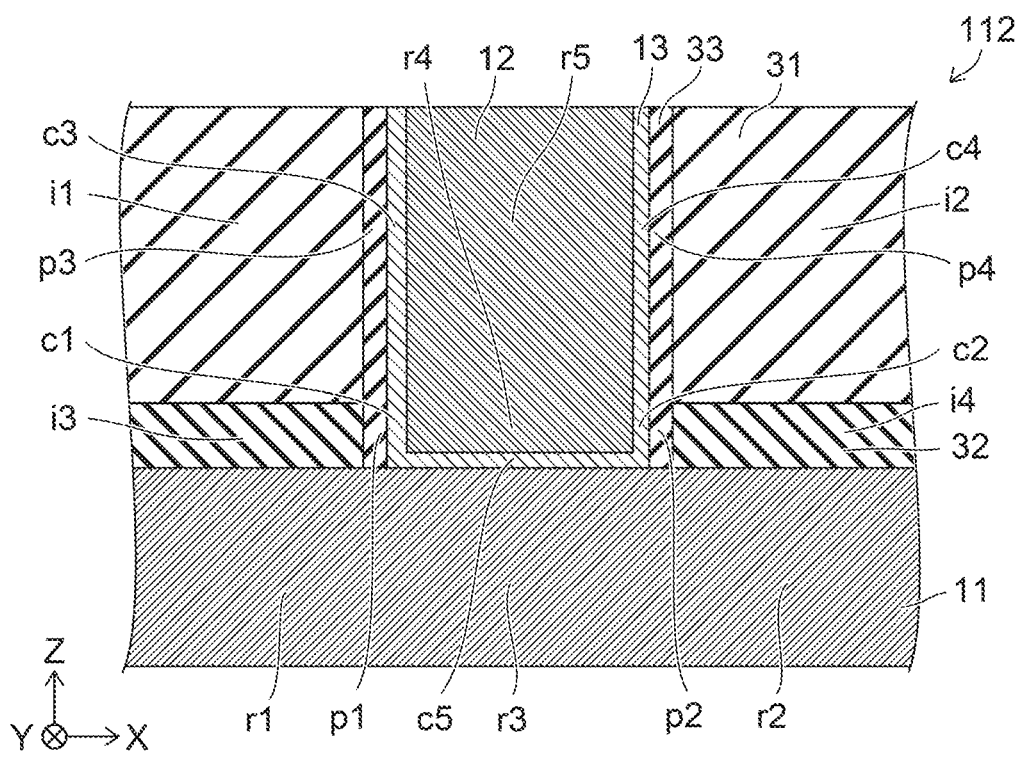
FIG. 5 is a schematic cross-sectional view illustrating an isolator according to the first embodiment.

FIG. 5 is a schematic cross-sectional view illustrating an isolator according to the first embodiment.

As shown in FIG. 5, the isolator 112 according to the embodiment also includes the first conductive member 11, the second conductive member 12, the first insulating member 31, the second insulating member 32, and the third insulating member 33. In the isolator 112, the side surface of the second conductive member 12 is substantially perpendicular to the X-Y plane. For example, in the isolator 112, the side surface of the third conductive member 13 is substantially perpendicular to the X-Y plane. For example, in the isolator 112, the side surface of the third insulating member 33 is substantially perpendicular to the X-Y plane. Otherwise, the configuration of the isolator 112 may be the same as the configuration of the isolator 110. The stress is relaxed in the isolator 112 as well. An isolator can be provided in which stable characteristics are obtained.

Figure 6:
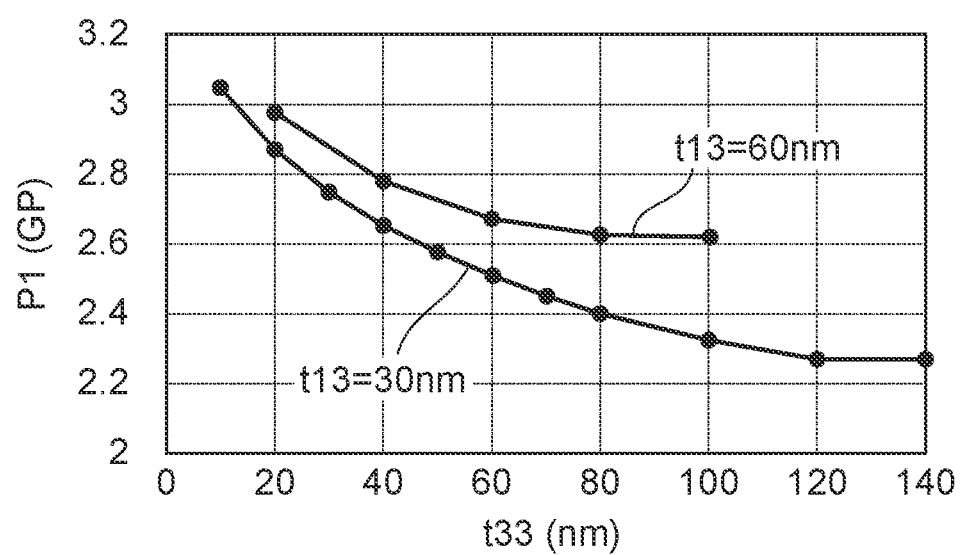
FIG. 6 is a graph illustrating characteristics of the isolator according to the first embodiment.

FIG. 6 is a graph illustrating characteristics of the isolator according to the first embodiment.

FIG. 6 illustrates simulation results of the relationship between the thickness t33 of the third insulating member 33 and stress P1 generated at the end portion 32e of the second insulating member 32. The horizontal axis of FIG. 6 is the thickness t33. The vertical axis of FIG. 6 is the stress P1. FIG. 6 shows the results when the thickness t13 of the third conductive member 13 (e.g., the barrier metal) is 30 nm and 60 nm. As described above, the thickness t33 corresponds to the length along the first direction (the X-axis direction) of the third insulating member 33. The thickness t13 corresponds to the length along the first direction (the X-axis direction) of the third conductive member 13. In the simulation, the Young's modulus of the first insulating member 31 is 70 GPa; the Young's modulus of the second insulating member 32 is 230 GPa; and the Young's modulus of the third insulating member 33 is 70 GPa. The physical property values of copper are applied to the first and second conductive members 11 and 12. The physical property values of tantalum are applied to the third conductive member 13.

As shown in FIG. 6, the stress P1 decreases as the thickness t33 increases. A small stress P1 is stably obtained when the thickness t33 is not less than 60 nm.

Figure 7A:
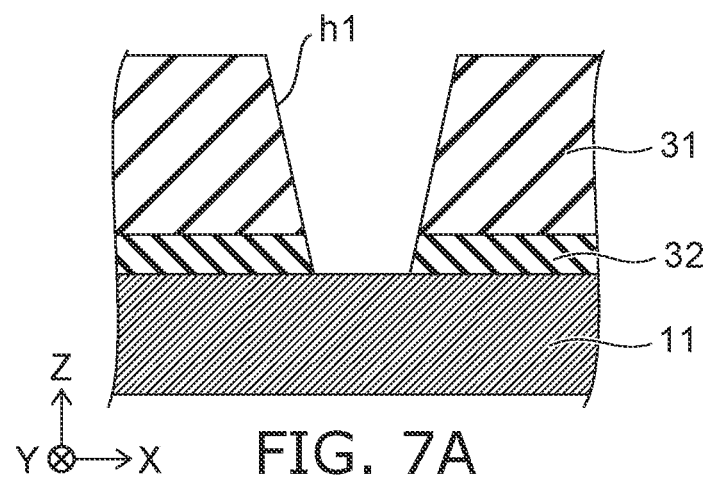
FIGS. 7A to 7C are schematic cross-sectional views illustrating a method for manufacturing the isolator according to the first embodiment.
Figure 7B:
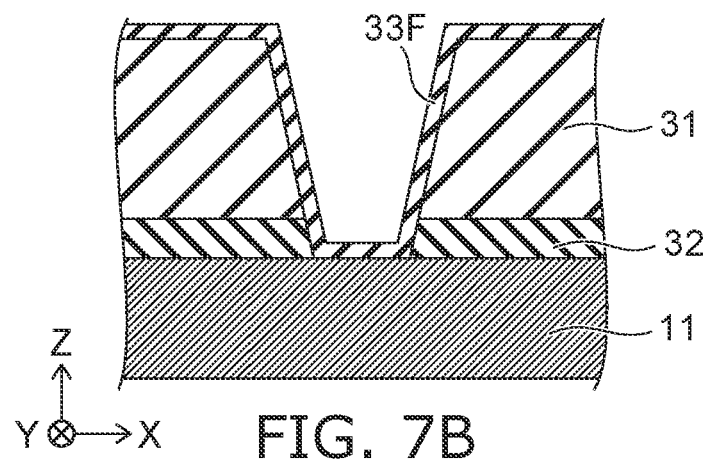
Figure 7C:
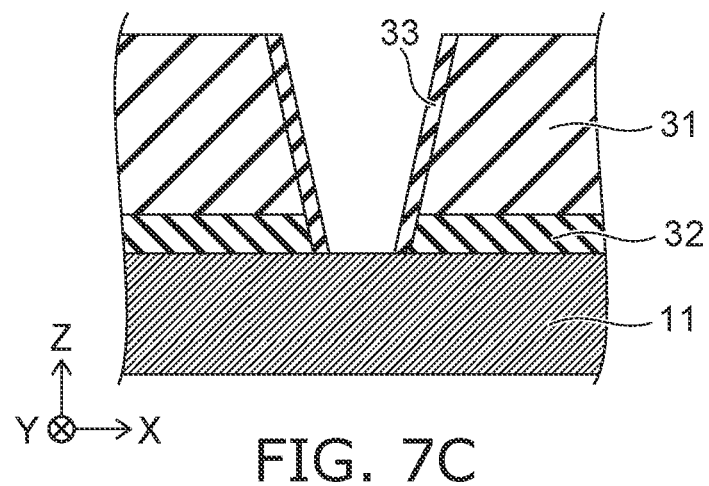

FIGS. 7A to 7C are schematic cross-sectional views illustrating a method for manufacturing the isolator according to the first embodiment.

As shown in FIG. 7A, a first layer that is used to form the second insulating member 32 is provided on the first conductive member 11; and a second layer that is used to form the first insulating member 31 is provided on the first layer. A hole h1 is formed by removing portions of these layers. The second insulating member 32 and the first insulating member 31 are obtained thereby. The removal (the formation of the hole h1) described above is performed by, for example, RIE (Reactive Ion Etching), etc.

As shown in FIG. 7B, a film 33F that is used to form the third insulating member 33 is formed at the sidewall of the hole h1.

For example, the film 33F is formed by CVD (Chemical Vapor Deposition), etc.

As shown in FIG. 7C, the third insulating member 33 is obtained by removing the unnecessary portion of the film 33F. For example, the removal of the unnecessary portion of the film 33F is performed by anisotropic etching.

Subsequently, the third conductive member 13 is formed, and the second conductive member 12 is obtained by filling a conductive member into the remaining space of the hole h1. The surface is planarized by CMP (chemical mechanical polishing) or the like as necessary. The isolator (e.g., the isolator 110, etc.) according to the embodiment is obtained thereby.

According to embodiments, an isolator can be provided in which stable characteristics are obtained.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in isolators such as conductive members, insulating members, conductive parts, connection members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all isolators practicable by an appropriate design modification by one skilled in the art based on the isolators described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions.

Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An isolator, comprising:
   a first conductive member including a first partial region, a second partial region, and a third partial region, a direction from the first partial region toward the second partial region being along a first direction, the third partial region being between the first partial region and the second partial region;
   a second conductive member electrically connected to the first conductive member, the second conductive member including a fourth partial region and a fifth partial region, the fourth partial region being between the third partial region and the fifth partial region in a second direction crossing the first direction;
   a first insulating member including a first insulating region and a second insulating region, the fifth partial region being between the first insulating region and the second insulating region in the first direction;
   a second insulating member including a third insulating region and a fourth insulating region, the fourth partial region being between the third insulating region and the fourth insulating region in the first direction, the third insulating region being between the first partial region and the first insulating region in the second direction, the fourth insulating region being between the second partial region and the second insulating region in the second direction; and
   a third insulating member including a first portion and a second portion, the first portion being between the third insulating region and the fourth partial region in the first direction, the second portion being between the fourth partial region and the fourth insulating region in the first direction, a Young's modulus of the third insulating member being less than a Young's modulus of the second insulating member.

2. The isolator according to claim 1, further comprising:
   a third conductive member including a first conductive region and a second conductive region,
   the first conductive region being between the first portion and the fourth partial region in the first direction,
   the second conductive region being between the fourth partial region and the second portion in the first direction,
   the Young's modulus of the third insulating member being less than a Young's modulus of the third conductive member.

3. An isolator, comprising:
   a first conductive member including a first partial region, a second partial region, and a third partial region, a direction from the first partial region toward the second partial region being along a first direction, the third partial region being between the first partial region and the second partial region;
   a second conductive member electrically connected to the first conductive member, the second conductive member including a fourth partial region and a fifth partial region, the fourth partial region being between the third partial region and the fifth partial region in a second direction crossing the first direction;
   a first insulating member including a first insulating region and a second insulating region, the fifth partial region being between the first insulating region and the second insulating region in the first direction;
   a second insulating member including a third insulating region and a fourth insulating region, the fourth partial region being between the third insulating region and the fourth insulating region in the first direction, the third insulating region being between the first partial region and the first insulating region in the second direction, the fourth insulating region being between the second partial region and the second insulating region in the second direction, the second insulating member including silicon and nitrogen; and
   a third insulating member including a first portion and a second portion, the first portion being between the third insulating region and the fourth partial region in the first direction, the second portion being between the fourth partial region and the fourth insulating region in the first direction, the third insulating member including silicon and oxygen.

4. The isolator according to claim 2, wherein
   the third insulating member includes a third portion and a fourth portion,
   the third portion is between the first insulating region and the fifth partial region in the first direction,
   the fourth portion is between the fifth partial region and the second insulating region in the first direction,
   the third conductive member includes a third conductive region and a fourth conductive region,
   the third conductive region is between the third portion and the fifth partial region in the first direction, and
   the fourth conductive region is between the fifth partial region and the fourth portion in the first direction.

5. The isolator according to claim 4, wherein
   the third conductive member includes a fifth conductive region, and
   the fifth conductive region is between the third partial region and the fourth partial region.

6. The isolator according to claim 2, wherein
   the first conductive region contacts the first portion and the fourth partial region, and
   the second conductive region contacts the fourth partial region and the second portion.

7. The isolator according to claim 1, wherein
   the Young's modulus of the third insulating member is less than a Young's modulus of the second conductive member.

8. The isolator according to claim 1, wherein
   a Young's modulus of the first insulating member is less than the Young's modulus of the second insulating member.

9. The isolator according to claim 1, wherein
   a length along the second direction of the first insulating member is not less than 5 µm.

10. The isolator according to claim 1, further comprising:
    a first conductive part and a second conductive part,
    a portion of the first insulating member being between the first conductive part and the second conductive part in the second direction,
    one of the first conductive part or the second conductive part being electrically connected to one of the first conductive member or the second conductive member.

11. The isolator according to claim 10, further comprising:
    a connection member electrically connecting the one of the first conductive part or the second conductive part and the one of the first conductive member or the second conductive member.

12. The isolator according to claim 1, wherein the Young's modulus of the second insulating member is not less than 200 GPa and not more than 400 Pa.

13. The isolator according to claim 1, wherein the Young's modulus of the third insulating member is not less than 50 GPa and not more than 100 Pa.

14. The isolator according to claim 1, wherein the third insulating member includes a third portion and a fourth portion,
the third portion is between the first insulating region and the fifth partial region in the first direction, and
the fourth portion is between the fifth partial region and the second insulating region in the first direction.

15. The isolator according to claim 1, wherein a length along the second direction of the second conductive member is not less than 5 μm.

16. The isolator according to claim 1, wherein the first portion contacts the third insulating region, and the second portion contacts the fourth insulating region.

17. The isolator according to claim 1, wherein a length along the second direction of the second insulating member is not less than 5 nm and not more than 20 nm.

18. The isolator according to claim 1, wherein the third insulating region is directly between the first partial region and the first insulating region in the second direction, and
the fourth insulating region is directly between the second partial region and the second insulating region in the second direction.

19. The isolator according to claim 1, wherein the fourth and fifth partial members comprises a single conductive member having tapered sides such that a width in the first direction gets larger moving in the second direction away from the first conductive member.

20. The isolator according to claim 19, wherein the first portion is disposed on a first one of the tapered sides from a top to a bottom of the single conductive member,
the first portion is disposed directly between the single conductive member and the first insulating member,
the first portion is disposed directly between the single conductive member and the second insulating member,
the second portion is disposed on a second one of the tapered sides,
the second portion is disposed directly between the single conductive member and the first insulating member, and
the second portion is disposed directly between the single conductive member and the second insulating member.

21. The isolator according to claim 1, wherein each of the first and second portions and the third and fourth insulating regions are disposed in direct contact with the first conductive member.

22. The isolator according to claim 1, wherein the second conductive member is directly connected to the first conductive member,
the third insulating member is directly disposed on sides of the second conductive member opposed in the first direction and is directly connected to the first conductive member.

23. The isolator according to claim 22, wherein the second insulating member is directly disposed on sides of the third insulating opposed in the first direction, is directly connected to the third insulating member, and directly connected to the first conductive member.

24. The isolator according to claim 1, comprising an antenna connected to the isolator.

25. The isolator according to claim 3, wherein the third insulating member further includes at least one selected from the group consisting of nitrogen and carbon.

26. The isolator according to claim 3, wherein the second insulating member does not include oxygen, or a concentration of oxygen in the second insulating member is less than a concentration of oxygen in the third insulating member.

27. The isolator according to claim 3, further comprising:
a third conductive member including a first conductive region and a second conductive region,
the first conductive region being between the first portion and the fourth partial region in the first direction,
the second conductive region being between the fourth partial region and the second portion in the first direction,
the third conductive member including at least one selected from the group consisting of Ti, Ta, TiN, and TaN.

* * * * *